US010408640B2

(12) United States Patent
Sato

(10) Patent No.: US 10,408,640 B2
(45) Date of Patent: Sep. 10, 2019

(54) MAGNETOMETRIC SENSOR

(71) Applicant: KABUSHIKI KAISHA TOKAI RIKA DENKI SEISAKUSHO, Aichi (JP)

(72) Inventor: Yoshihiko Sato, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 54 days.

(21) Appl. No.: 15/817,708

(22) Filed: Nov. 20, 2017

(65) Prior Publication Data

US 2018/0164129 A1    Jun. 14, 2018

(30) Foreign Application Priority Data

Dec. 12, 2016  (JP) ................................ 2016-240418

(51) Int. Cl.
| G01D 5/16 | (2006.01) |
| G01R 33/00 | (2006.01) |
| G01R 33/09 | (2006.01) |
| B82Y 25/00 | (2011.01) |

(52) U.S. Cl.
CPC ........... *G01D 5/16* (2013.01); *G01R 33/0094* (2013.01); *G01R 33/096* (2013.01); *B82Y 25/00* (2013.01)

(58) Field of Classification Search
CPC ..... G01N 27/904; G01N 27/902; F16L 55/38; F16L 55/40; F16L 2101/30
USPC ........ 324/242, 244, 243, 240, 239, 228, 200
See application file for complete search history.

(56) References Cited

U.S. PATENT DOCUMENTS

| 6,118,540 A | * | 9/2000 | Roy ....................... G01N 21/88 356/394 |
| 7,362,450 B2 | * | 4/2008 | Zaman ................. G01N 21/952 356/237.2 |
| 2001/0012392 A1 | * | 8/2001 | Langley ............ H01L 21/67167 382/145 |
| 2008/0180089 A1 | | 7/2008 | Stolfus et al. |
| 2010/0085038 A1 | | 4/2010 | Hinz |
| 2011/0095603 A1 | * | 4/2011 | Lee ......................... B60L 50/51 307/10.1 |

(Continued)

FOREIGN PATENT DOCUMENTS

| EP | 2648006 | 10/2013 |
| JP | 2015-190895 | 11/2015 |

OTHER PUBLICATIONS

Official Communication issued in European Patent Office (EPO) Patent Application No. 17203061.1, dated Apr. 30, 2018.

*Primary Examiner* — Giovanni Astacio-Oquendo
(74) *Attorney, Agent, or Firm* — Greenblum & Bernstein, P.L.C.

(57) ABSTRACT

A magnetometric sensor includes a plurality of magnetometric sensor elements each including a plurality of magneto-sensitive portions arranged, in each of fan-shaped magneto-sensitive regions, intersecting with a radial direction of the magneto-sensitive regions. The magnetometric sensor elements are configured such that the magneto-sensitive regions are arranged rotated at 90° intervals and a bridge circuit is formed by electrically connecting the magnetometric sensor elements to each other. The magneto-sensitive portions each have a shape defined enclosed by two arcs to have a same width such that a resistance value thereof varies according to a change in a direction of a magnetic field.

9 Claims, 8 Drawing Sheets

(56) References Cited

U.S. PATENT DOCUMENTS

2011/0316473 A1* 12/2011 Yen .................. H02J 7/027
                                                320/107
2015/0002142 A1   1/2015 Kubik
2016/0294213 A1* 10/2016 Morrison ............ H02J 9/061

* cited by examiner

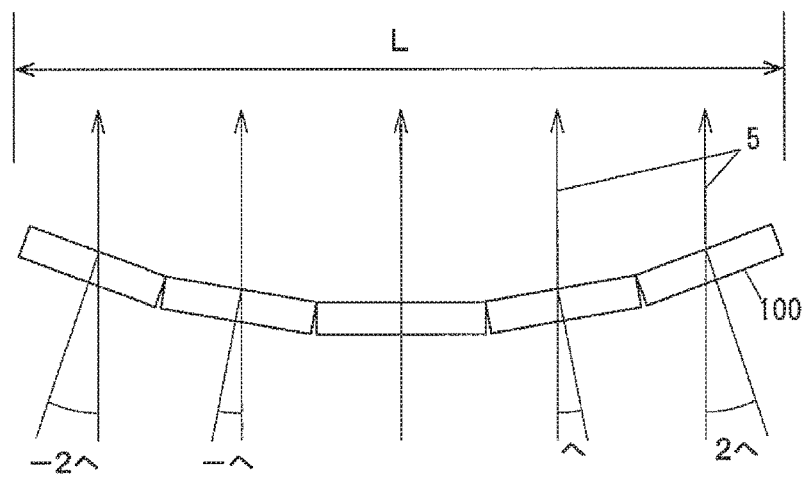

MAGNETOMETRIC SENSOR

BACKGROUND

Technical Field

The present invention relates to a magnetometric sensor.

Related Art

A rotary encoder including a magnetometric sensor having eight magneto-sensitive films formed on a substrate to form two bridge circuits is known as an example of related art (see JP 2015-190895 A, for example).

This rotary encoder has a magnet arranged facing the substrate, the magnet having a magnetic field intensity at which a resistance value saturates, and the rotary encoder is configured to detect relative angle positions of the substrate and the magnet on the basis of output signals of a first phase and a second phase obtained by the bridge circuit.

SUMMARY

The magnetometric sensor of the rotary encoder according to the related art has a problem in that even if a magnetic field is applied at a saturation intensity, the output signal will distort and deviate from an ideal sine wave, and the angle accuracy will drop as a result.

Accordingly, an object of the invention is to provide a magnetometric sensor capable of improving the angle accuracy.

According to one aspect of the invention, provided is a magnetometric sensor including: a magneto-sensitive portion having a shape enclosed between two arcs and with a uniform width, the magneto-sensitive portion having a resistance value that varies depending on changes in the direction of a magnetic field; and a plurality of magnetometric sensor elements each having a plurality of the magneto-sensitive portions arranged, in fan-shaped magneto-sensitive regions, intersecting with a radial direction of the magneto-sensitive regions, the magneto-sensitive regions being rotated at 90° intervals, and the magnetometric sensor elements being electrically connected to each other to form a bridge circuit.

According to an aspect of the invention, the angle accuracy can be improved.

BRIEF DESCRIPTION OF THE DRAWINGS

FIG. 5A is a schematic diagram illustrating a relationship between a magneto-sensitive portion of the magnetometric sensor according to the embodiment and a magnetic field vector in the case where the magneto-sensitive portion has a curved shape, and FIG. 5B is a graph showing angle accuracy in the case where the magneto-sensitive portion has a curved shape.

DESCRIPTION OF EMBODIMENTS

Overview of Embodiments

A magnetometric sensor according to an embodiment is primarily constituted of a magneto-sensitive portion having a shape enclosed between two arcs and with a uniform width, the magneto-sensitive portion having a resistance value that varies depending on changes in the direction of a magnetic field; and a plurality of magnetometric sensor elements each having a plurality of the magneto-sensitive portions arranged, fan-shaped magneto-sensitive regions, intersecting with a radial direction of the magneto-sensitive regions, the magneto-sensitive regions being rotated at 90° intervals, and the magnetometric sensor elements being electrically connected to each other to form a bridge circuit.

In the magnetometric sensor, the magneto-sensitive portions have a curved shape enclosed between the two arcs rather than a linear shape enclosed between two straight lines. Accordingly, errors with respect to the angle of a detected magnetic field are partially canceled out, and angle accuracy is improved, as compared to a case where the magneto-sensitive portions have a linear shape.

Embodiment

Overview of Magnetometric Sensor 1

Figure 1A:
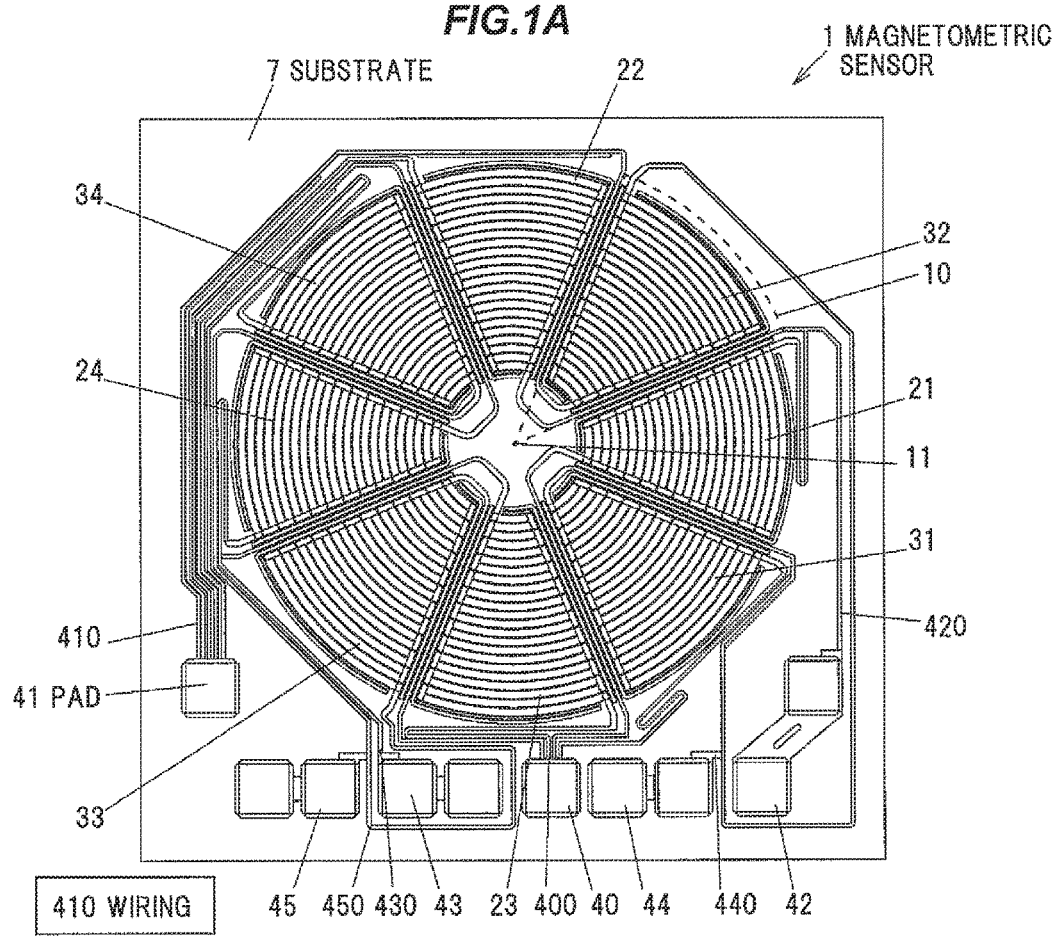
FIG. 1A is a schematic diagram illustrating an example of a magnetometric sensor according to an embodiment.
Figure 1B:
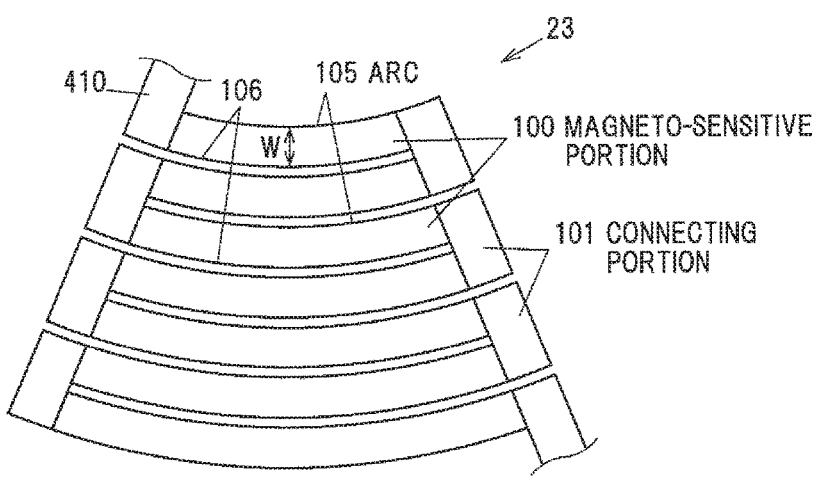
FIG. 1B is a schematic diagram illustrating an example of an MR device.
Figure 2A:
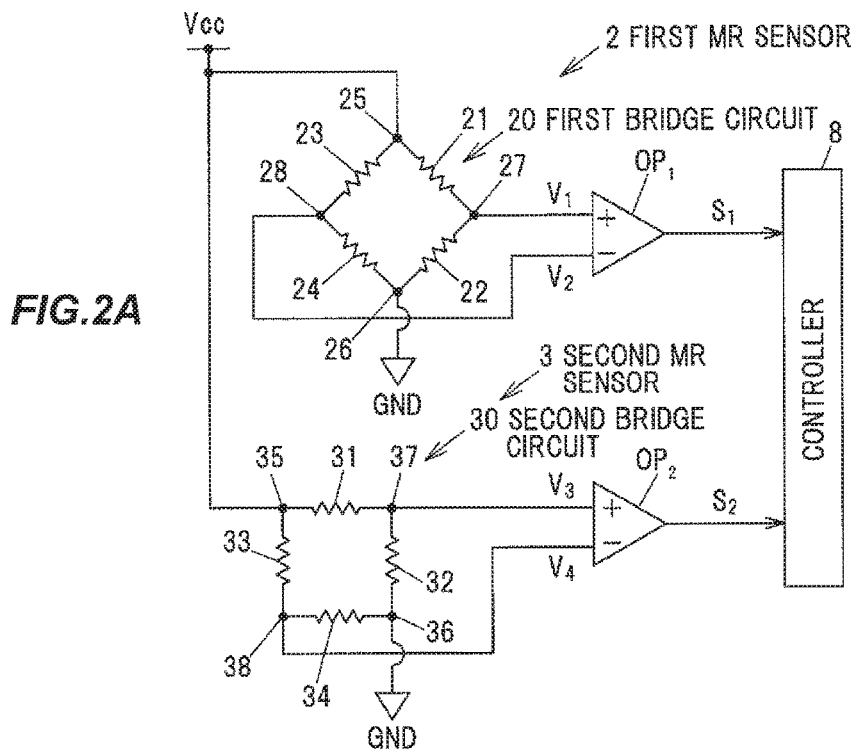
FIG. 2A is an equivalent circuit diagram illustrating an example of the magnetometric sensor according to the embodiment.
Figure 2B:
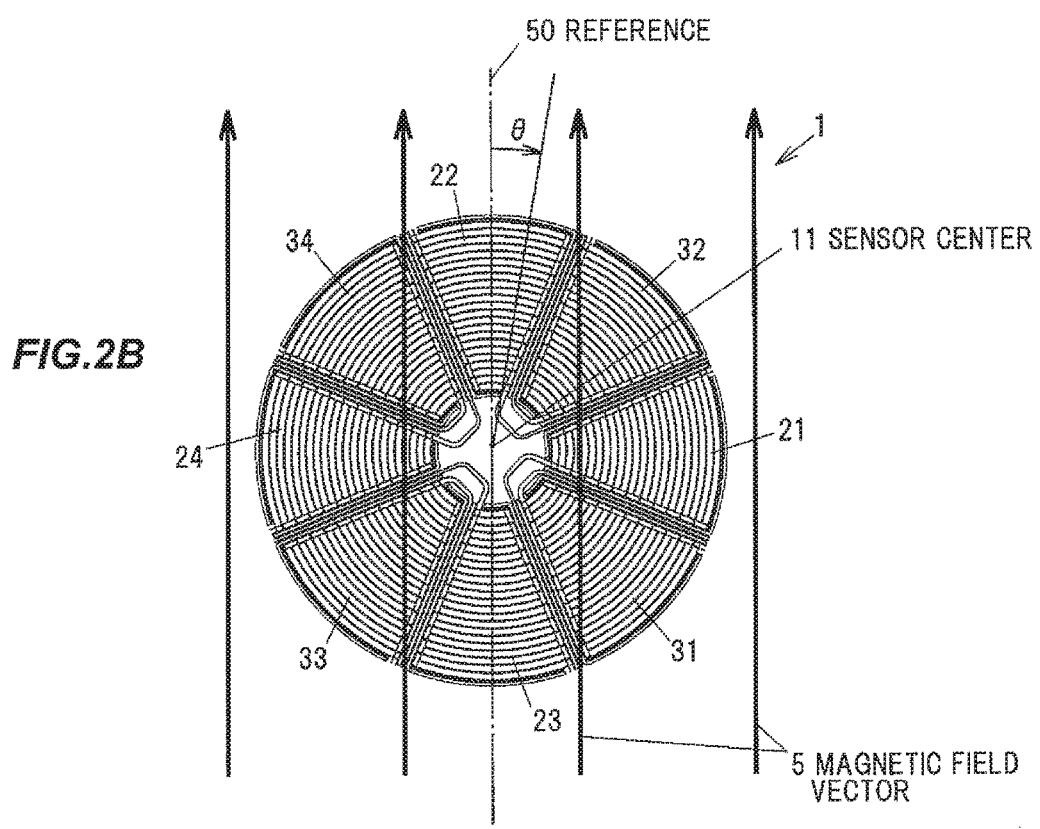
FIG. 2B is a schematic diagram illustrating an example of the magnetometric sensor and an angle of a magnetic field vector.

FIG. 1A is a schematic diagram illustrating an example of a magnetometric sensor according to an embodiment, and FIG. 1B is a schematic diagram illustrating an example of a magneto-resistive (MR) device. FIG. 2A is an equivalent circuit diagram illustrating an example of the magnetometric sensor according to the embodiment, and FIG. 2B is a schematic diagram illustrating an example of the magnetometric sensor and an angle of a magnetic field vector. In the drawings associated with the following embodiments, ratios between elements in the drawings may be different from the actual ratios.

A magnetometric sensor 1 is, for example, formed on a substrate 7 as illustrated in FIG. 1A. The magnetometric sensor 1 has pads 40 to 45, and is connected to an operational amplifier $OP_1$ and an operational amplifier $OP_2$, described later, via the pads 40 to 45.

As illustrated in FIGS. 1A to 2B, for example, the magnetometric sensor 1 is primarily constituted of a magneto-sensitive portion 100 and a plurality of magnetometric sensor elements. The magneto-sensitive portion 100 has a shape enclosed between two arcs 105 and 106 and with a uniform width W, and has a resistance value that varies depending on changes in the direction of a magnetic field. Each of the magnetometric sensor elements has a plurality of the magneto-sensitive portions 100 arranged, in fan-shaped magneto-sensitive regions 10, intersecting with a radial direction of the magneto-sensitive regions 10. The magneto-sensitive regions 10 are rotated at 90° intervals, and the magnetometric sensor elements are electrically connected to each other to form a bridge circuit. Note that in the present embodiment, the direction of the magnetic field is expressed as a magnetic field vector 5.

The magneto-sensitive regions 10 according to the present embodiment are fan-shaped regions obtained by dividing a single circle into eight equal parts. As such, the magnetometric sensor 1 has first to fourth MR devices 21 to 24, and fifth to eighth MR devices 31 to 34. The first to fourth MR devices 21 to 24 and the fifth to eighth MR devices 31 to 34 form two bridge circuits, namely a first bridge circuit 20 and a second bridge circuit 30, which output signals of different phases. The first to fourth MR devices 21 to 24 and the fifth to eighth MR devices 31 to 34 have the same basic configuration; thus, each of these devices will be denoted simply as "MR device" hereinafter.

Configuration of MR Device

The magneto-sensitive portions 100 of the MR device according to the present embodiment are configured such that the two arcs 105 and 106 are arcs of concentric circles centered on a sensor center 11. In the present embodiment, the magneto-sensitive portions 100 are arranged at equal intervals.

The magneto-sensitive portions 100 are each formed as a thin film of an alloy that is primarily composed of a ferromagnetic metal such as Ni or Fe. As illustrated in FIG. 1B, for example, end portions of magneto-sensitive portions 100 adjacent in the radial direction are connected to each other via connecting portions 101. Each of the connecting portions 101 is a metal film formed from a metal such as aluminum whose resistance does not vary depending on changes in the direction of the magnetic field vector 5.

The first bridge circuit 20 is formed by the first to fourth MR devices 21 to 24. The first to fourth MR devices 21 to 24 are arranged centered on the sensor center 11 at 90° intervals.

A node 25 serving as a point of connection between the first MR device 21 and the third MR device 23 is electrically connected to a source voltage $V_{CC}$, as illustrated in FIG. 2A. The source voltage $V_{CC}$ is supplied via the pad 40 and wiring 400. A node 26 serving as a point of connection between the second MR device 22 and the fourth MR device 24 is electrically connected to GND. This GND is electrically connected to the pad 41 and wiring 410.

The first MR device 21 and the second MR device 22 form a half-bridge circuit. This half-bridge circuit outputs a midpoint potential $V_1$ at a node 27 between the first MR device 21 and the second MR device 22. The midpoint potential $V_1$ is inputted to a non-inverting input terminal (+side) of the operational amplifier $OP_1$ via wiring 420 and the pad 42.

The third MR device 23 and the fourth MR device 24 also form a half-bridge circuit. This half-bridge circuit outputs a midpoint potential $V_2$ at a node 28 between the third MR device 23 and the fourth MR device 24. The midpoint potential $V_2$ is inputted to an inverting input terminal (−side) of the operational amplifier $OP_1$ via wiring 430 and the pad 43. The operational amplifier $OP_1$ outputs, to a controller 8, an output signal $S_1$ obtained by differentially amplifying the midpoint potential $V_1$ inputted to the non-inverting input terminal and the midpoint potential $V_2$ inputted to the inverting input terminal.

The second bridge circuit 30 is formed by the fifth to eighth MR devices 31 to 34. The fifth to eighth MR devices 31 to 34 are arranged centered on the sensor center 11 at 90° intervals. The second bridge circuit 30 corresponds to the first bridge circuit 20 being rotated 45°, as illustrated in FIGS. 2A and 2B, for example.

A node 35 serving as a point of connection between the fifth MR device 31 and the seventh MR device 33 is electrically connected to the source voltage $V_{CC}$, as illustrated in FIG. 2A. A node 36 serving as a point of connection between the sixth MR device 32 and the eighth MR device 34 is electrically connected to GND.

The fifth MR device 31 and the sixth MR device 32 form a half-bridge circuit. This half-bridge circuit outputs a midpoint potential $V_3$ at a node 37 between the fifth MR device 31 and the sixth MR device 32. The midpoint potential $V_3$ is inputted to a non-inverting input terminal (+side) of the operational amplifier $OP_2$ via wiring 440 and the pad 44.

The seventh MR device 33 and the eighth MR device 34 also form a half-bridge circuit. This half-bridge circuit outputs a midpoint potential $V_4$ at a node 38 between the seventh MR device 33 and the eighth MR device 34. The midpoint potential $V_4$ is inputted to an inverting input terminal (−side) of the operational amplifier $OP_2$ via wiring 450 and the pad 45. The operational amplifier $OP_2$ outputs, to the controller 8, an output signal $S_2$ obtained by differentially amplifying the midpoint potential $V_3$ inputted to the non-inverting input terminal and the midpoint potential $V_4$ inputted to the inverting input terminal.

The operational amplifier $OP_1$ and the operational amplifier $OP_2$ are arranged on the substrate 7 along with the controller 8, for example.

Configuration of Controller 8

Figure 3A:
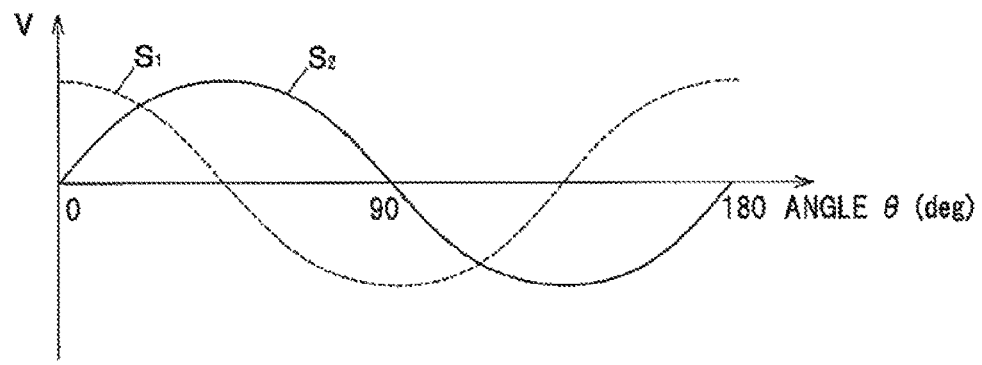
FIG. 3A is a graph showing an example of output voltages from a first bridge circuit and a second bridge circuit of the magnetometric sensor according to the embodiment.
Figure 3B:
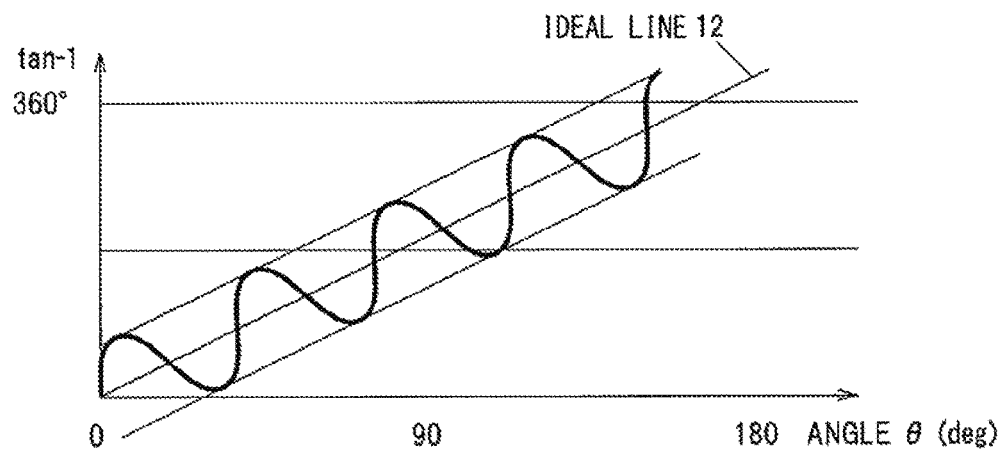
FIG. 3B is a graph showing an example of a calculated angle.
Figure 3C:
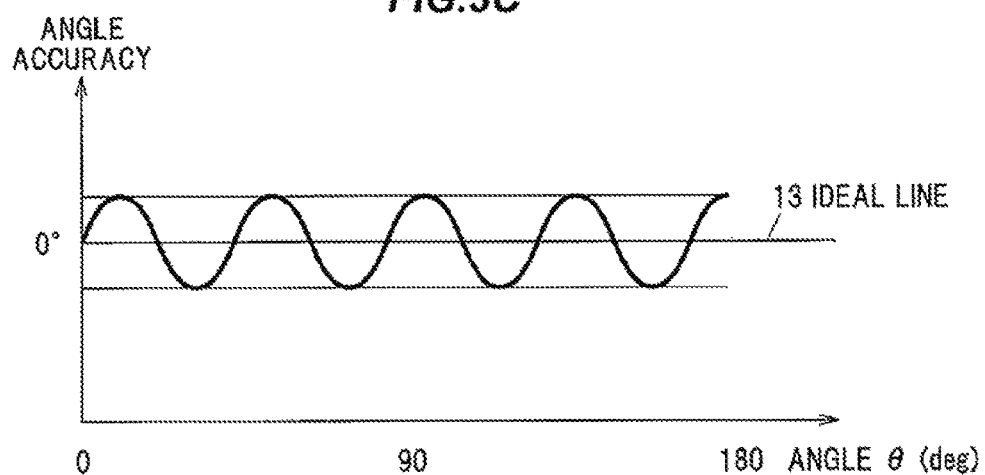
FIG. 3C is a graph showing an example of angle accuracy, which is a difference from an actual angle.

FIG. 3A is a graph showing an example of output voltages from a first bridge circuit and a second bridge circuit of the magnetometric sensor according to the embodiment, FIG. 3B is a graph showing an example of a calculated angle, and FIG. 3C is a graph showing an example of angle accuracy, which is a difference from an actual angle. In FIG. 3A, the horizontal axis represents an angle θ (deg), and the vertical axis represents a voltage V. In FIG. 3B, the horizontal axis represents an angle θ (deg), and the vertical axis represents Atan (deg). In FIG. 3C, the horizontal axis represents an angle θ (deg), and the vertical axis represents angle accuracy (deg). The bold solid lines in FIGS. 3B and 3C represent a calculated angle.

The controller 8 is, for example, a microcomputer including: a central processing unit (CPU) that carries out computations, processes, and the like on acquired data; a random access memory (RAM) and a read-only memory (ROM) that are semiconductor memories; and the like. The controller 8 calculates an angle of the magnetic field vector 5, or in other words, a rotation angle of a rotating magnetic field, on the basis of the acquired output signals $S_1$ and $S_2$.

The angle of the magnetic field vector 5 is expressed as an angle θ relative to a reference 50 indicated by the long dashed short dashed line in FIG. 2B, for example. As illustrated in FIG. 2B, the angle θ takes the clockwise direction as a positive direction. A magnet that generates the magnetic field vector 5 is arranged facing the magnetometric sensor 1 so as to rotate about the sensor center 11. For example, the magnet is cylindrical and is magnetized such that one side of the cylinder in the vertical direction serves as the N pole and the other side serves as the S pole.

The reference 50 passes through the sensor center 11 to divide the second MR device 22 and the third MR device 23 into two equal parts. Accordingly, the output signal $S_1$ obtained by differentially amplifying the midpoint potentials $V_1$ and $V_2$ outputted from the first bridge circuit 20 is $\cos\theta$, as shown in FIG. 3A. The output signal $S_2$ outputted from the second bridge circuit 30 is $\sin\theta$ that is out of phase with the output signal $S_1$. $\cos\theta$ and $\sin\theta$ have a period of 180°.

The controller 8 calculates $\tan\theta$ on the basis of the output signals $S_1$ and $S_2$, and further calculates $\text{Atan}(\tan^{-1}=-S_2/S_1)$ to find $\theta$. An ideal line 12 indicated in FIG. 3B is a line where an ideal angle on the horizontal axis and a calculated angle on the vertical axis match. FIG. 3C shows a difference between the ideal angle and the calculated angle (that is, the angle accuracy), which ideally matches an ideal line 13. The angle accuracy is indicated as deviation from the ideal line 13, as shown in FIG. 3C, for example.

Results of simulations in the case where the magneto-sensitive portions 100 have a curved shape and the case where the magneto-sensitive portions 100 have a linear shape will be described next.

Figure 4A:
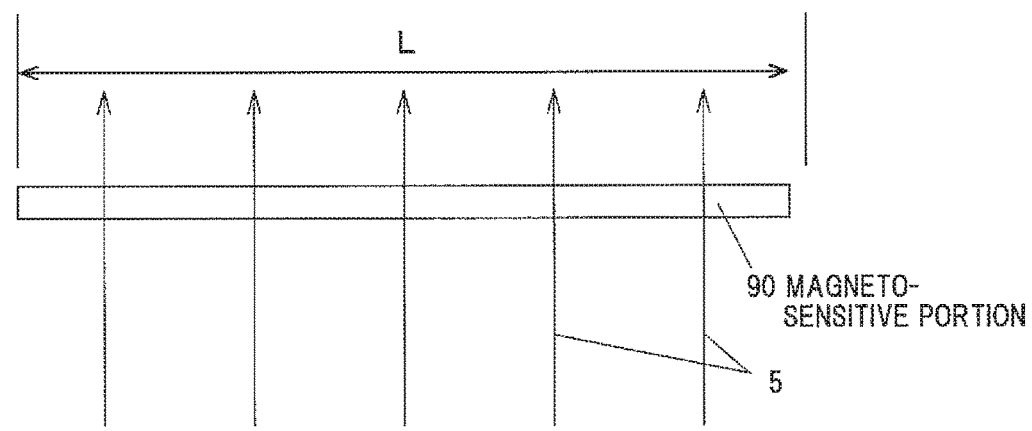
FIG. 4A is a schematic diagram illustrating a relationship between a magneto-sensitive portion according to a first comparative example and a magnetic field vector in the case where the magneto-sensitive portion has a linear shape.
Figure 4B:
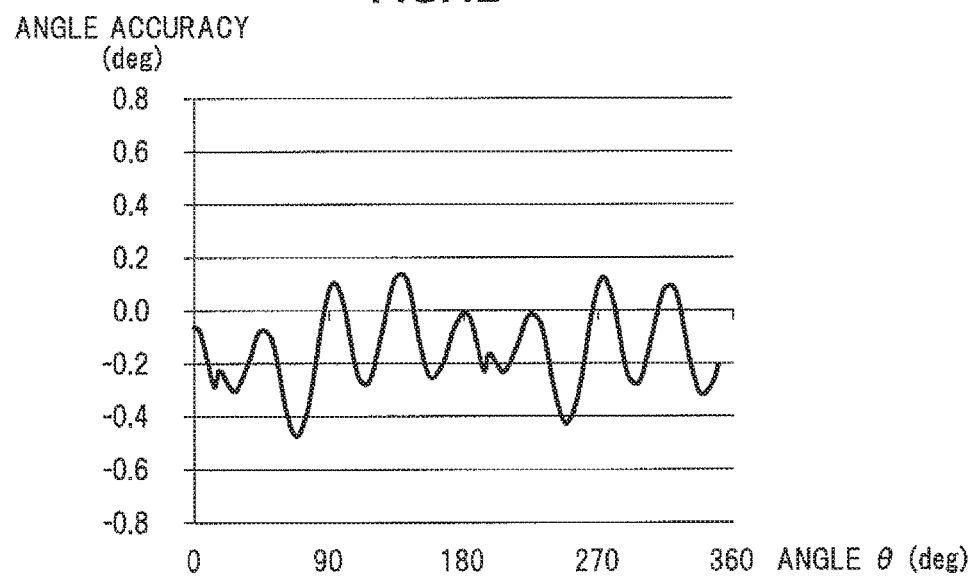
FIG. 4B is a graph showing angle accuracy in the case where the magneto-sensitive portion has a linear shape.

FIG. 4A is a schematic diagram illustrating a relationship between a magneto-sensitive portion according to a first comparative example and a magnetic field vector in the case where the magneto-sensitive portion has a linear shape, and FIG. 4B is a graph showing angle accuracy in the case where the magneto-sensitive portion has a linear shape. FIG. 5A is a schematic diagram illustrating a relationship between a magneto-sensitive portion of the magnetometric sensor according to the embodiment and a magnetic field vector in the case where the magneto-sensitive portion has a curved shape, and FIG. 5B is a graph showing angle accuracy in the case where the magneto-sensitive portion has a curved shape. In FIGS. 4B and 5B, the horizontal axis represents the angle (deg), and the vertical axis represents the angle accuracy (deg). The angle accuracy of a magneto-sensitive portion 100$b$ according to the first comparative example was actually measured, whereas the angle accuracy of the magneto-sensitive portion 100 according to the present embodiment is the result of a simulation.

First, the widths of the magneto-sensitive portion 100 according to the present embodiment and the magneto-sensitive portion 100$b$ according to the first comparative example are the same. The lengths of the magneto-sensitive portion 100 according to the present embodiment and the magneto-sensitive portion 100$b$ according to the first comparative example are denoted as L, as illustrated in FIGS. 4A and 5A. Furthermore, the intensities of the magnetic field vector 5 acting on the magneto-sensitive portion 100 according to the present embodiment and of the magnetic field vector 5 acting on the magneto-sensitive portion 100$b$ according to the first comparative example are the same.

Because the magnetic field vector 5 acts in a uniform direction, when a resistance value of the magneto-sensitive portion 100$b$ according to the first comparative example is represented by $R(\theta)$, the following Equation 1 holds true. Note that $r(\theta)$ represents a resistance value at a given position of the magneto-sensitive portion 100$b$. As such, $R(\theta)$ is the sum total of $r(\theta)$ at the given positions.

$$R(\theta)=r(\theta)+r(\theta)+r(\theta)$$

$$R(\theta)=\Sigma_{n=1\ldots m+1}r(\theta) \quad (1)$$

where, m is a random integer, and thus Equation 1 is to find the sum total of m+1 instances of $r(\theta)$.

On the other hand, the magneto-sensitive portion 100 illustrated in FIG. 5A is represented as a plurality of linear sections that correspond to a pattern divided on the basis of the given positions where the resistance values $r(\theta)$ have been obtained according to the first comparative example and are rotated by $\pm n\alpha$ to be in a curved shape. $R(\theta)$ is the sum total of the resistance values at positions where the magnetic field vector 5 is orthogonal to the magneto-sensitive portion 100, that is, $r(\theta)$ corresponds to the sum total of the resistance values on the left and right sides of that orthogonal position.

$$R(\theta)=r(\theta)+r(\theta+\alpha)+r(\theta-\alpha)+r(\theta+2\alpha)+r(\theta-2\alpha)$$

$$R(\theta)=r(\theta)+\Sigma_{n=1\ldots m/2}r(\theta+n\alpha)+\Sigma_{n=1\ldots m/2}r(\theta-n\alpha) \quad (2)$$

In the first comparative example, the resistance $R(\theta)$ is constituted of only the term $r(\theta)$, and thus, angle errors arise at a period of approximately 45° and cannot be fully canceled out, which in turn results in the angle errors, or in other words, the angle accuracy is low.

However, in the present embodiment, which has a curved shape, Equation 2 differs from Equation 1 with respect to the second and third terms. The second and third terms are symmetrical with respect to the center of the magneto-sensitive portion 100, and thus, angle errors are partially canceled out and suppressed. The angle accuracy is thus thought to be higher than that in the first comparative example.

The angle accuracy in a second comparative example, a first example, and a second example that were actually created will be described next. The angle accuracy was measured by applying the magnetic field vector 5 to the magnetometric sensors according to the second comparative example, the first example, and the second example in a uniform direction using a Helmholtz coil. The arrangement of the MR devices, the configurations of the bridge circuits are the same as those of the second comparative example, the first example, and the second example.

Second Comparative Example

Figure 6A:
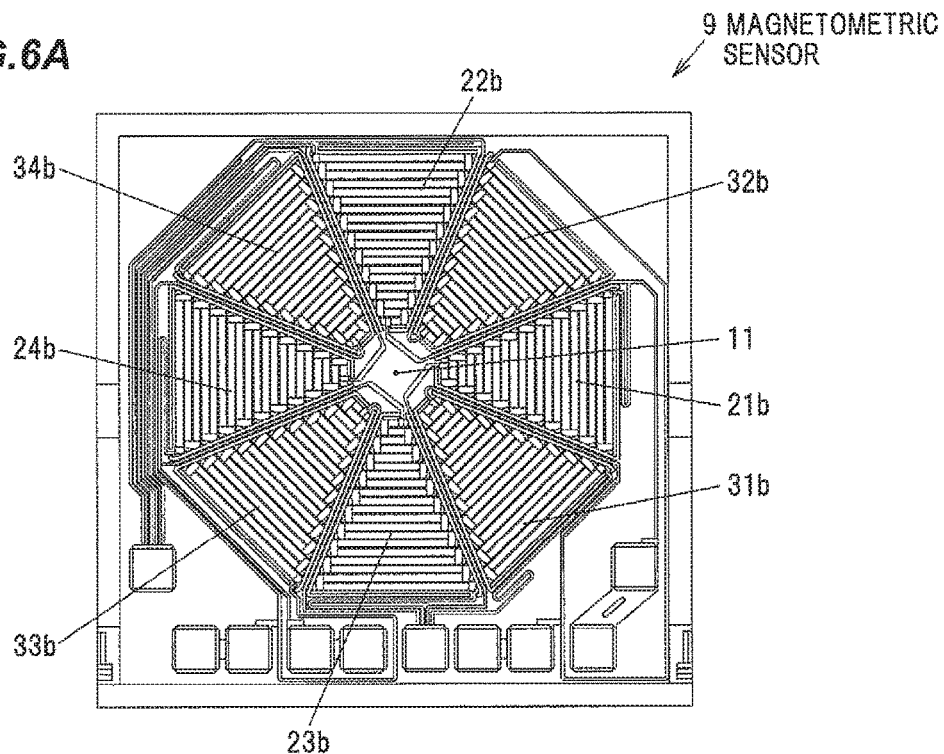
FIG. 6A is a schematic diagram illustrating a magnetometric sensor according to a second comparative example.
Figure 6B:
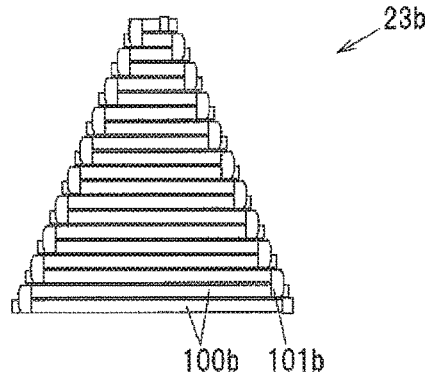
FIG. 6B is a schematic diagram illustrating one MR device according to the second comparative example in an enlarged manner.
Figure 6C:
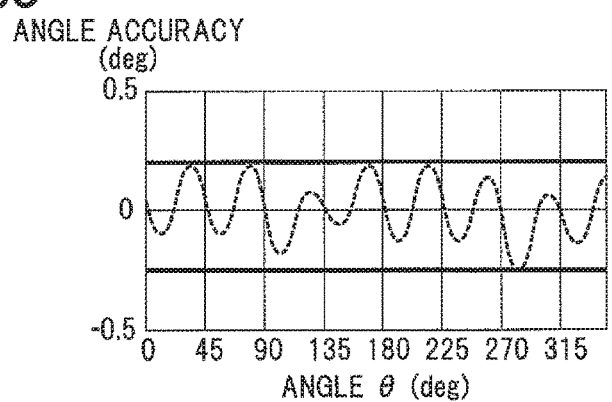
FIG. 6C is a graph showing angles of a magnetism vector and angle accuracy according to the second comparative example.

FIG. 6A is a schematic diagram illustrating a magnetometric sensor according to a second comparative example, FIG. 6B is a schematic diagram illustrating one MR device according to the second comparative example in an enlarged manner, and FIG. 6C is a graph showing angles of a magnetism vector and angle accuracy according to the second comparative example.

As illustrated in FIGS. 6A and 6B, the magneto-sensitive portions 100$b$ of a magnetometric sensor 9 according to the second comparative example have a linear shape.

Like the magnetometric sensor 1, in the magnetometric sensor 9, two bridge circuits are formed by first to fourth MR devices 21$b$ to 24$b$ and fifth to eighth MR devices 31$b$ to 34$b$.

End portions of the magneto-sensitive portions 100$b$ are alternately connected to each other via connecting portions 101$b$. The connecting portions 101$b$ of the magneto-sensitive portions 100$b$ are formed of a material and with a width and thickness that are the same as those of the connecting portions 101 of the magneto-sensitive portions 100 according to the first example and those of the connecting portions 101$a$ of the magneto-sensitive portions 100$a$ according to the second example.

As shown in FIG. 6C, for the magnetometric sensor 9 according to the second comparative example, the angle accuracy was measured at approximately ±0.22.

First Example

Figure 7A:
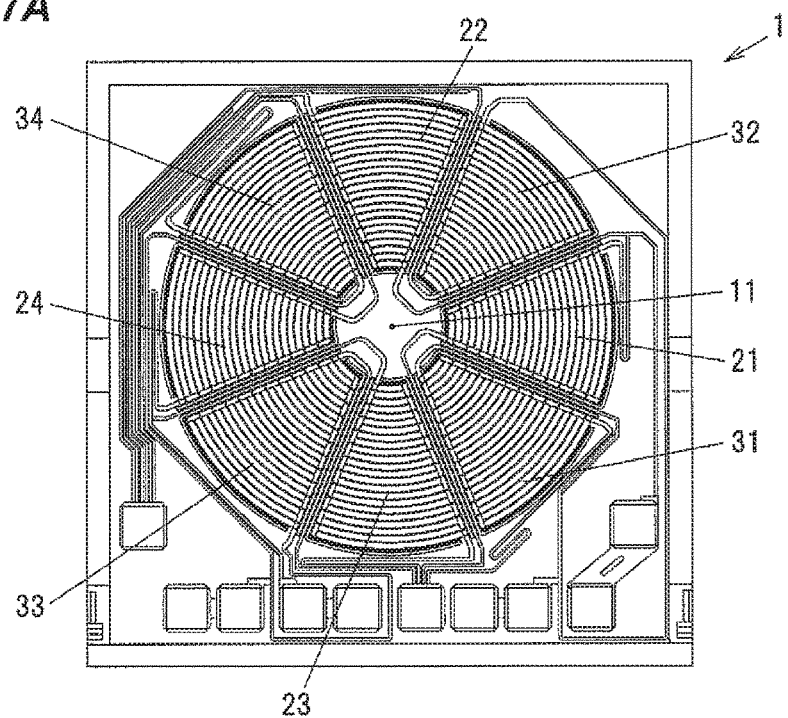
FIG. 7A is a schematic diagram illustrating a magnetometric sensor according to a first example.
Figure 7B:
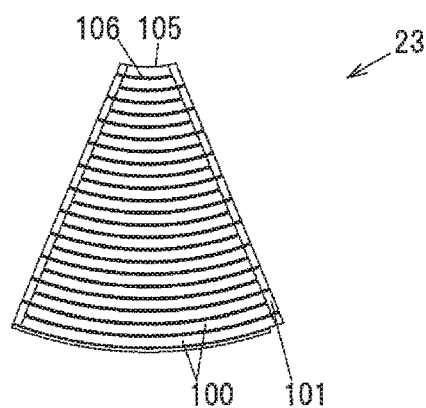
FIG. 7B is a schematic diagram illustrating one MR device according to the first example in an enlarged manner.
Figure 7C:
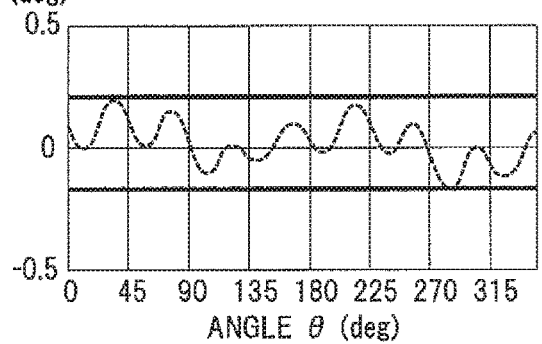
FIG. 7C is a graph showing angles of a magnetism vector and angle accuracy according to the first example.

FIG. 7A is a schematic diagram illustrating a magnetometric sensor according to a first example, FIG. 7B is a schematic diagram illustrating one MR device according to the first example in an enlarged manner, and FIG. 7C is a graph showing angles of a magnetism vector and angle accuracy according to the first example.

In the magnetometric sensor 1, two bridge circuits are formed by the first to fourth MR devices 21 to 24 and the fifth to eighth MR devices 31 to 34.

As illustrated in FIGS. 7A and 7B, the magneto-sensitive portions 100 are shaped as arcs of concentric circles centered on the sensor center 11, in the same manner as the magneto-sensitive portions 100 according to the embodiment. The magnetometric sensor 1 according to the first example is capable of canceling out angle errors as indicated by Equation 2 above, and thus, the errors are suppressed. Thus, as shown in FIG. 7C, for the magnetometric sensor 1 according to the first example, the angle accuracy was measured at approximately ±0.15, which is better than that of the second comparative example.

Second Example

Figure 8A:
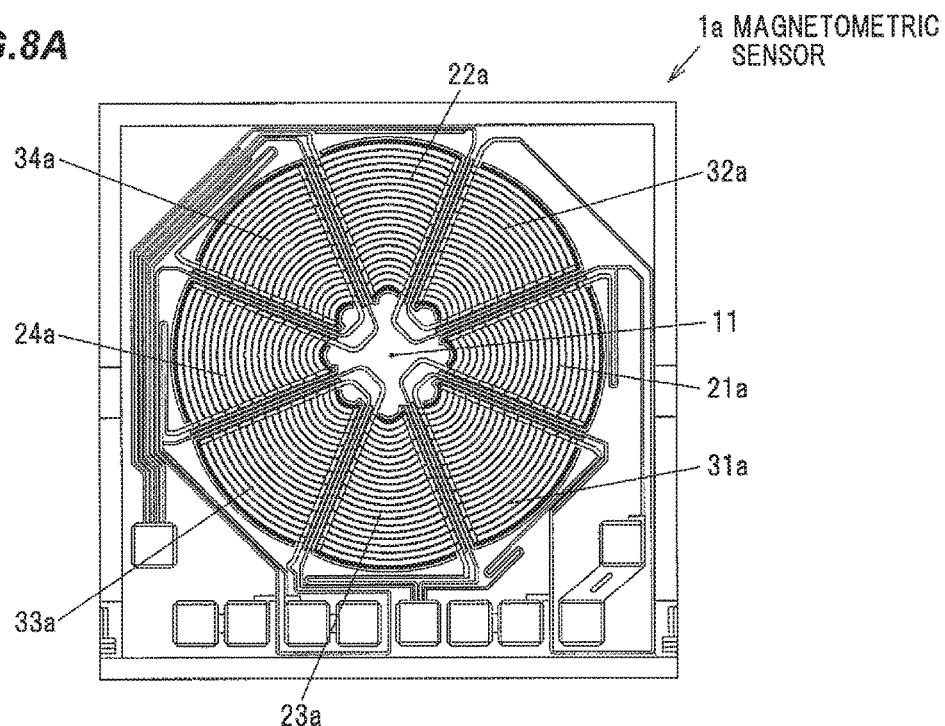
FIG. 8A is a schematic diagram illustrating a magnetometric sensor according to a second example.
Figure 8B:
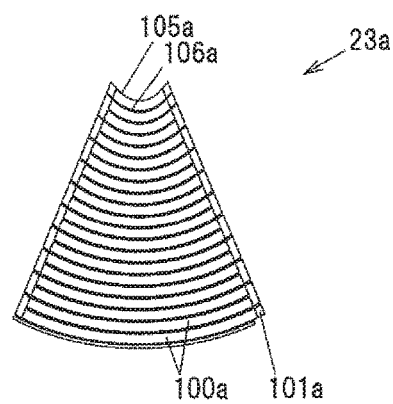
FIG. 8B is a schematic diagram illustrating one MR device according to the second example in an enlarged manner.
Figure 8C:
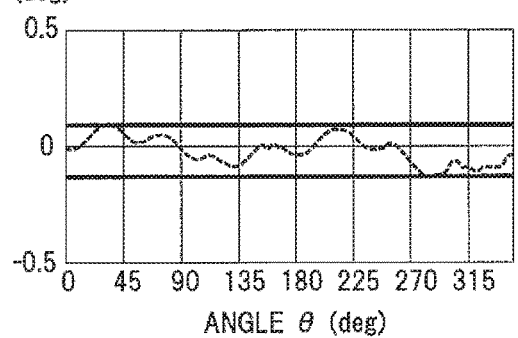
FIG. 8C is a graph showing angles of a magnetism vector and angle accuracy according to the second example.

FIG. 8A is a schematic diagram illustrating a magnetometric sensor according to a second example, FIG. 8B is a schematic diagram illustrating one MR device according to the second example in an enlarged manner, and FIG. 8C is a graph showing angles of a magnetism vector and angle accuracy according to the second example.

Like the magnetometric sensor 1, in a magnetometric sensor 1a, two bridge circuits are formed by first to fourth MR devices 21a to 24a and fifth to eighth MR devices 31a to 34a.

As illustrated in FIGS. 8A and 8B, in the magneto-sensitive portions 100a of the magnetometric sensor 1a according to the second example, two arcs (arcs 105a and 106a) are arcs having a greater curvature than the arcs of concentric circles centered on the sensor center 11.

The magnetometric sensor 1a according to the second example is capable of canceling out angle errors as indicated by Equation 2 above and has the increased curvature, which further canceled out the angle errors and in turn resulted in better angle accuracy of approximately ±0.11 than those of the second comparative example and the first example.

Based on the foregoing, it can be seen that the angle accuracy is better with the magneto-sensitive portions having a curved shape than the magneto-sensitive portions having a linear shape, and that the angle accuracy improves as the curvature increases.

Effect of Embodiments

With the magnetometric sensor 1 according to the present embodiment, the angle accuracy can be improved. Specifically, in the magnetometric sensor 1, the magneto-sensitive portions 100 have a curved shape enclosed between the two arcs 105 and 106 rather than a linear shape enclosed between two straight lines. Accordingly, errors with respect to the angle of the detected magnetic field vector 5 are partially canceled out, and the angle accuracy is improved, as compared to a case where the magneto-sensitive portions has a linear shape.

In the magnetometric sensor 1a according to the second example, the two arcs 105a and 106a are arcs having a greater curvature than the arcs 105 and 106 of concentric circles centered on the sensor center 11. This makes it possible to further improve the angle accuracy.

Although several embodiments and examples of the invention have been described above, these embodiments and examples are merely examples, and the invention according to claims is not intended to be limited thereto. Such novel embodiments and examples can be implemented in various other forms, and various omissions, substitutions, changes, and the like can be made without departing from the spirit and scope of the invention. In addition, all combinations of the features described in these embodiments and examples are not necessary to solve the problem. Furthermore, these embodiments and examples are included within the spirit and scope of the invention and also within the scope of the invention described in the claims and equivalents thereof.

The invention claimed is:

1. A magnetometric sensor, comprising a plurality of magnetometric sensor elements each comprising a plurality of magneto-sensitive portions arranged, in each of fan-shaped magneto-sensitive regions, intersecting with a radial direction of the magneto-sensitive regions,
    wherein the magnetometric sensor elements are configured such that the magneto-sensitive regions are arranged rotated at 90° intervals and a bridge circuit is formed by electrically connecting the magnetometric sensor elements to each other, and
    wherein the magneto-sensitive portions each having a shape defined enclosed by two arcs to have a same width such that a resistance value thereof varies according to a change in a direction of a magnetic field.

2. The magnetometric sensor according to claim 1, wherein the two arcs comprise arcs of concentric circles centered on a sensor center.

3. The magnetometric sensor according to claim 1, wherein the two arcs comprise arcs having a greater curvature than arcs of concentric circles centered on a sensor center.

4. The magnetometric sensor according to claim 1, wherein the magneto-sensitive regions comprise fan-shaped regions formed by dividing a single circle into eight equal parts, and
    wherein the magnetometric sensor elements are formed in the eight magneto-sensitive regions so as to form two bridge circuits configured to output signals of different phases.

5. The magnetometric sensor according to claim 2, wherein the magneto-sensitive regions comprise fan-shaped regions formed by dividing a single circle into eight equal parts, and
    wherein the magnetometric sensor elements are formed in the eight magneto-sensitive regions so as to form two bridge circuits configured to output signals of different phases.

6. The magnetometric sensor according to claim 3, wherein the magneto-sensitive regions comprise fan-shaped regions formed by dividing a single circle into eight equal parts, and
    wherein the magnetometric sensor elements are formed in the eight magneto-sensitive regions so as to form two bridge circuits configured to output signals of different phases.

7. The magnetometric sensor according to claim 1, wherein the plurality of magnetometric sensor elements each comprising an MR device, and wherein an accuracy of a rotation angle is within ±0.22 where the rotation angle is measured according to a rotation around a sensor center of a magnetic field vector generated on the MR device.

8. The magnetometric sensor according to claim 1, wherein the plurality of magnetometric sensor elements each comprising an MR device, and wherein an accuracy of a rotation angle is within ±0.15 where the rotation angle is measured according to a rotation around a sensor center of a magnetic field vector generated on the MR device.

9. The magnetometric sensor according to claim 1, wherein the plurality of magnetometric sensor elements comprising an MR device, and wherein an accuracy of a rotation angle is within ±0.11 where the rotation angle is measured according to a rotation around a sensor center of a magnetic field vector generated on the MR device.

* * * * *